United States Patent [19]
Von Basse et al.

[11] Patent Number: 4,965,464
[45] Date of Patent: Oct. 23, 1990

[54] POWER AMPLIFIER CIRCUIT FOR INTEGRATED DIGITAL CIRCUITS

[75] Inventors: Paul-Werner Von Basse, Wolfratshausen; Jean-Marc Dortu, Munich; Andrea Herlitzek, Munich; Dieter Kohlert, Munich; Ulrich Schaper, Munich, all of Fed. Rep. of Germany

[73] Assignee: Siemens Aktiengesellschaft, Berlin and Munich, Fed. Rep. of Germany

[21] Appl. No.: 409,577

[22] Filed: Sep. 19, 1989

[30] Foreign Application Priority Data

Oct. 14, 1988 [DE] Fed. Rep. of Germany ....... 3835119

[51] Int. Cl.$^5$ .................. H03K 3/01; H03K 19/094
[52] U.S. Cl. .................. 307/270; 307/448; 307/450; 307/263; 307/544; 307/546
[58] Field of Search ............... 307/443, 448, 450, 270, 307/263, 544, 546

[56] References Cited

FOREIGN PATENT DOCUMENTS 0055795 9/1981 European Pat. Off. .
2649356 7/1977 Fed. Rep. of Germany .

OTHER PUBLICATIONS

"A 3-ns GaAs 4 kx 1-bit Static RAM", by N. Yokoyama et al, IEEE Trans. Electron Devices, vol. Ed-32 (1985), 9, pp. 1797-1801.

"Fully Decoded GaAs 1 kb Static RAM Using Closely Space Electrode FETs", by F. Katano et al, IEEE IEDM (1983), pp. 86-89.

"Introduction to VLSI Systems Reading", by C. Mead, Addison Wesley, (1980), pp. 17-18.

"A GaAs 1-kbit Static RAM with a Shallow Recessed-Gate Structure FET", by S. Takano, IEEE Trans. Electron Devices, vol. Ed-32, (1985), pp. 1135-1139.

"High Gain Sense Amplifier", by S. N. Chakravarti et al, IBM, Dec. 1977, pp. 2607-2608.

*Primary Examiner*—Stanley D. Miller
*Assistant Examiner*—Margaret Rose Wambach
*Attorney, Agent, or Firm*—Hill, Van Santen, Steadman & Simpson

[57] ABSTRACT

Power amplifier circuit for integrated digital circuits that combines the low permanent current consumption of a NOF push-pull output stage with the well-defined high level of a NON-NOFF amplifier stage having external clamp diode. An optimization of the leading edge is additionally achieved by fast drive and transient overdrive. A preceding inverter reduces the input capacitance of the overall circuit.

9 Claims, 3 Drawing Sheets

POWER AMPLIFIER CIRCUIT FOR INTEGRATED DIGITAL CIRCUITS

BACKGROUND OF THE INVENTION

The present invention is directed to an amplifier circuit which solves the problem of how highly capacitative loaded lines within integrated GaAs circuits (as occur, in particular, in memory modules) can be charge-reversed in an optimally short time. Limiting a predetermined high level to a defined value is also guaranteed.

Prior art solutions are inadequate with regards to this problem and have the disadvantages set forth below.

The circuit shown in FIG. 1, (see, Yokoyama N., Onodera Hl, Shinoki T., Ohnishi H., Nishi H., "A 3-ns GaAs 4 kx 1-bit static RAM", IEEE Trans. Electron, Devices, Vol. Ed-32 (1985) 9, pages 1797–1801) is merely an inverter T11, T21 of a standard type that must be dimensioned especially large because of the high load. This causes a high current consumption. When a limitation of the high level is required, an additional (relatively large) clamp diode D1 must be provided.

The circuits of FIG. 2, (Katano F., Takahashi K., Uetake K., Ueda K., Yamamoto R., Higashisaka A., "Fully decoded GaAs 1 kB static RAM using closely space electrode FETs", IEEE IEDM; 1983, pages 336–339; Toyoda N., Kanazawa K., Terada T., Mochizuki M., Ikawa Yasuo, Hojo A., "A 256×4 GaAs static RAM", IEEE GaAs Symposium, 1983, pages 86–89) and FIG. 3, (Mead C., Conway L., "Introduction to VLSI systems, Reading", Addison Wesley, pages 17–18, 1980) are an improvement with reference to power consumption, since a switch to a low level occurs during a low level at the output of the gate of T32 (FIG. 2) or T33 (FIG. 3). As a result the current through T32 or T33 is considerably reduced. However, since T32 and T33 are NON-transistors (normally on transistors) a forward current that cannot be ignored still flows through T32 and T42 or through T33 and T43. A relatively large clamp diode D2 or D3 must likewise be provided for limiting the high level, requiring space and acting like an additional capacitative load.

The circuit of FIG. 4 (see Takonos., Tanino N., Yoshihara T., Mitsui Y., Nishitani K. "A GaAs 1-kbit static RAM with a shallow recessed-gate structure FET", IEEE Trans. Electron Devices, Vol. Ed-32 (1985), 6, pages 1135–1139) is most favorable with respect to power consumption. However, it does not achieve the full high level at the output since the transistor T34 acts as a source follower whose source potential always lies below the gate potential by at least a threshold voltage. As a consequence of the gate-source diode of T24, the gate potential of T34 cannot exceed the high level.

SUMMARY OF THE INVENTION

An object of the present invention is to provide a circuit arrangement that produces a quick charge reversal and thereby combines the low permanent current power consumption of a Knoff-Bush push-pull output stage with the well-defined high level of a NON-NOFF (normally on-normally off) amplifier stage having an external clamp diode.

The object of the present invention is achieved by an amplifier circuit having field effect transistors and diodes. In the amplifier circuit a first field effect transistor, a second field effect transistor, a third field effect transistor, a fourth field effect transistor, a fifth field effect transistor, a sixth field effect transistor, a seventh field effect transistor and an eighth field effect transistor are provided. The first field effect transistor, the third field effect transistor and the fifth field effect transistor are NON (normally on) transistors. The second field effect transistor, the fourth field effect transistor, the sixth field effect transistor, the seventh field effect transistor and the eighth field effect transistor are NOFF (normally off) transistors. The drain terminals of the first field effect transistor, of the third field effect transistor, of the fifth field effect transistor and of the seventh field effect transistor are connected to one another and the source terminals of the second field effect transistor, of the fourth field effect transistor, of the sixth field effect transistor and of the eighth field effect transistor are connected to one another.

A source terminal of the first field effect transistor is connected to the gate terminal of the first field effect transistor, to the drain terminal of the second field effect transistor, to the gate terminal of the fourth field effect transistor, to the gate terminal of the sixth field effect transistor and to the gate terminal of the eighth field effect transistor. The source terminal of the third field effect transistor is connected to the gate terminal of the third field effect transistor, to the drain terminal of the fourth field effect transistor and to the gate terminal of the fifth field effect transistor.

The source terminal of the fifth field effect transistor is connected to the drain terminal of the sixth field effect transistor and to the gate terminal of the seventh field effect transistor. The source terminal of the seventh field effect transistor is connected to the drain terminal of the eighth field effect transistor.

In one embodiment a clamp diode is provided and the drain terminal of the eighth field effect transistor is connected to the positive terminal of this diode. The source terminal of the eighth field effect transistor is connected to the negative terminal of this diode.

In another embodiment a ninth field effect transistor is provided and the gate terminal of the ninth field effect transistor is connected to the drain terminal of the sixth field effect transistor. The drain terminal of this ninth field effect transistor is connected to the gate terminal of the seventh field effect transistor. A first diode and a second diode are also provided and the source terminal of the ninth field effect transistor is connected to the positive terminal of this first diode. The source terminal of the third field effect transistor is connected to the positive terminal of this second diode. The negative terminals of the first diode and of the second diode are connected to one another and the negative terminal of the first diode is connected to the source terminal of the eighth field effect transistor.

In yet another embodiment a third diode, a tenth field effect transistor and an eleventh field effect transistor are provided. The positive terminal of this third diode is connected to the negative terminal of the second diode and the negative terminal of this third diode is connected to the source terminal of the eighth field effect terminal. The drain terminal of the tenth field effect transistor is connected to the drain terminal of the seventh field effect transistor. The source terminal of the tenth field effect transistor is connected to the gate terminal of the tenth field effect transistor, to the drain terminal of the eleventh field effect transistor and to the positive terminal of the third diode. The source terminal of the eleventh field effect transistor is connected to the source terminal of the eighth field effect transistor and the gate terminal of the eleventh field effect transistor is connected to the drain terminal of the eighth field effect transistor.

In addition, an optimization of the leading edge is achieved by a fast drive and transient, i.e. brief duration overdriving. A preceding inverter reduces the input capacitance of the overall circuit.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

The function of the circuit of the present invention shall be set forth first without taking the high-level limitation into consideration.

Figure 8A:
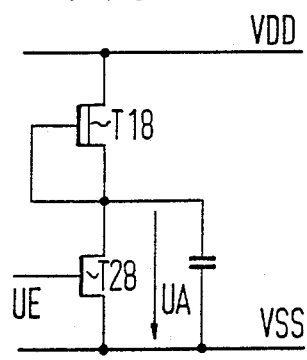
FIG. 8A is a circuit diagram of a DCFL inverter.
Figure 8B:
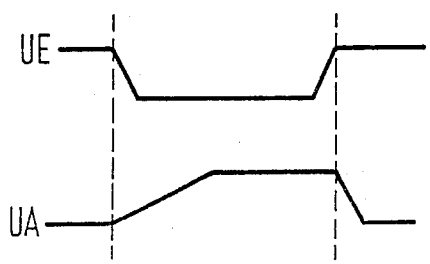
FIG. 8B shows the switch behavior of a DCFL inverter.

A main problem in circuits having unswitched load elements (standard NMOS circuit technology, NON (normally on) load elements in GaAs MESFET logics) is slow leading edges of the output signals, particularly for a high capacitative load. Since the load elements are operated with a constant gate-source voltage and the gate-source voltage of the switching transistors ranges from 0 to a maximum value, leading edges that are flatter than trailing edges will always result (FIG. 8).

Figure 9A:
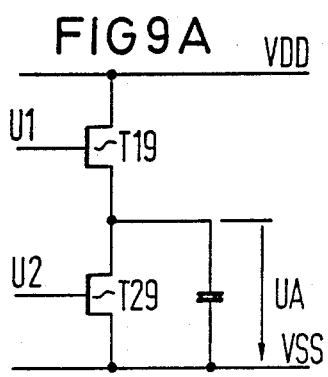
FIG. 9A is a circuit diagram of a NOFF push-pull stage.
Figure 9B:
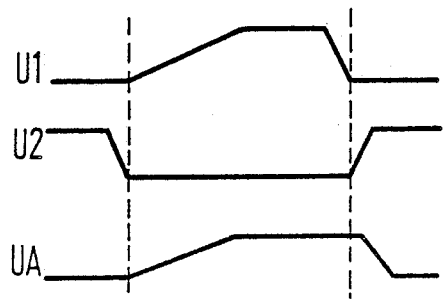
FIG. 9B shows the switch behavior of a NOFF push-pull stage.

When a push-pull output stage of NOFF transistors is used (FIG. 9), this problem is more pronounced since the pull-up output transistor (T19 in FIG. 9) is connected as a source follower, i.e., the output voltage UA (FIG. 9) always lies below the voltage U1 by the gate-source voltage of T19, so that the voltage rise of UA will always be slower than that of U1.

For this reason, it is necessary to drive the gate of the pull-up transistor with a circuit that provides an optimally high drive voltage having a fast leading edge. The circuit composed of T36, T46, T56 and T66 ("superbuffer"; Mead, C., Conway, L., Introduction to VLSI Systems, Reading, Addison Wesley, pages 17-18, 1980) meets this demand (FIG. 6).

The two output transistors of the push-pull stage must be driven by complementary signals. The inversion required for this purpose is likewise accomplished by the superbuffer T36, T46, T56, T66. The inverter T16, T26 serves the purpose of separating the capacitative load that is still relatively great from the preceding stage. Since both the superbuffer T36, T46, T56, T66 as well as the pull-down transistor T86 supply an adequately fast trailing edge, the simple inverter T16, T26 suffices for their drive.

In contrast to MOS transistors, the gate in the MESFET is not isolated from the channel, but is connected to it via a Schottky diode. The diode effect between the gate and the other terminals results therefrom as shown in FIG. 7. The forward voltage of these diodes determines the logical high-level in a circuit, since the voltage at the input of a gate (for example, inverter T16, T26 in FIG. 6) is limited by this diode.

Figure 6:
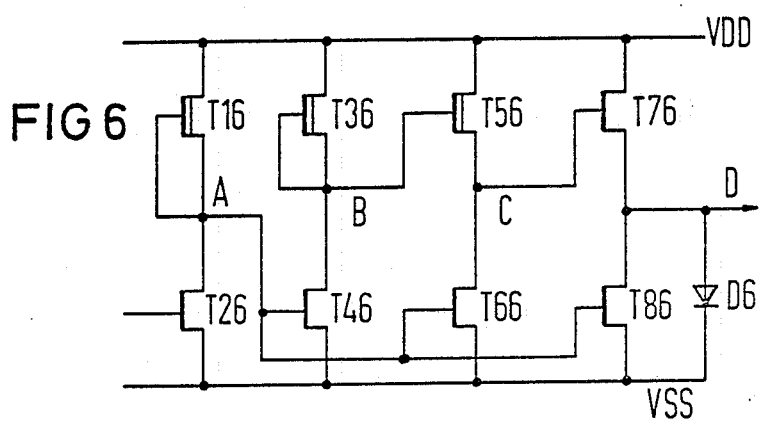
FIG. 6 is a circuit diagram of a circuit corresponding to the circuit diagram of FIG. 5 without the limiter section.
Figure 7:
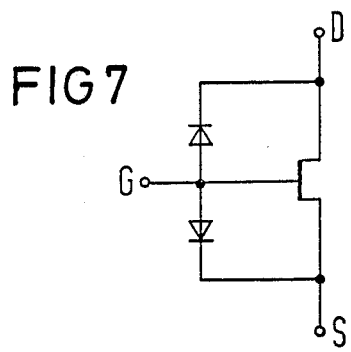
FIG. 7 is a simplified, equivalent circuit diagram of a GaAs MESFET.

It may be seen in FIG. 6 that such a limitation does not exist for the points B and C since they are not connected to gate inputs of transistors, their source terminals lie at VSS, and NON transistors do not inhibit until negative gate-source voltages. For this reason, the voltages at the points B and C can rise up to the supply voltage.

As a result the output voltage (print D) can also reach a voltage far above the defined high level (supply voltage greater than forward voltage of a gate diode). In some applications (for example, word line drive in a memory module), this can lead to the destruction of the gates.

Figure 1:
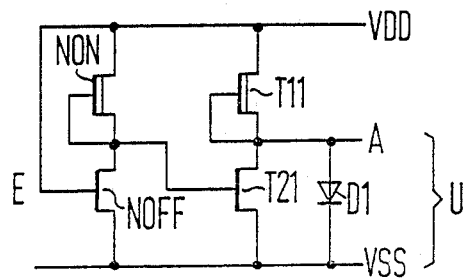
FIGS. 1-4 are circuit diagrams of prior art circuits related to the present invention.
Figure 2:
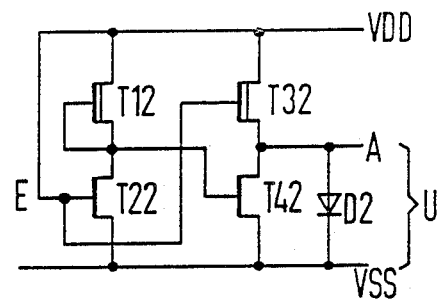
Figure 3:
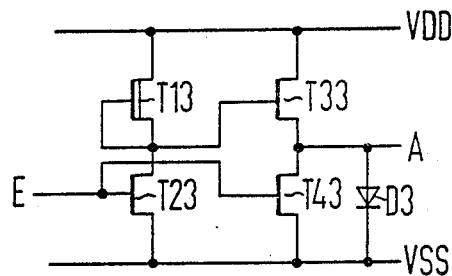
Figure 4:
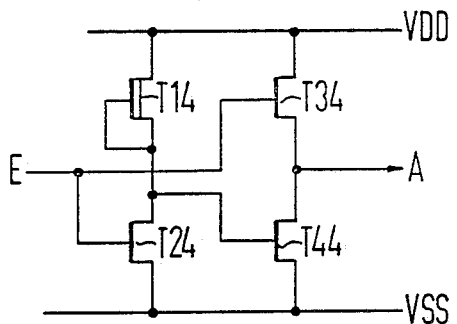
Figure 5:
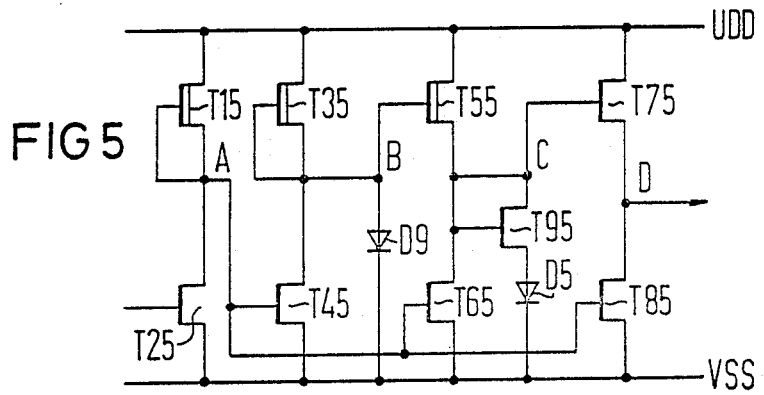
FIG. 5 is a circuit diagram of a circuit of the present invention including a limiter section.

The effect of a limitation of the output voltage by a clamp diode D6 (FIG. 6) would be that an extremely high gate-source voltage would be established at transistors T76 and, thus, a high current would flow through T76 and through the diode D6. Since T76 usually already involves transistors that are dimensioned large, an unacceptable permanent curve would result. A limitation of the gate potential of T76 (point C) thus proves necessary (FIG. 5).

More specifically the amplifier circuit of FIG. 6 is structured as follows. A first field effect transistor T16, a second field effect transistor T26, a third field effect transistor T36, a fourth field effect transistor T46, a fifth field effect transistor T56, a sixth field effect transistor T66, a seventh field effect transistor T76 and an eighth field effect transistor T86 are provided. The first field effect transistor T16, the third field effect transistor T36 and the fifth field effect transistor T56 are NON (normally on) transistors and the second field effect transistor T26, the fourth field effect transistor T46, the sixth field effect transistor T66, the seventh field effect transistor T76 and the eighth field effect transistor T86 are NOFF (normally off) transistors. The drain terminals of the first field effect transistor T16, of the third field effect transistor T36, of the fifth field effect transistor T56 and of the seventh field effect transistor T76 are connected to one another and the source terminals of the second field effect transistor T26, of the fourth field effect transistor T46, of the sixth field effect transistor T66 and of the eighth field effect transistor T86 are connected to one another.

A source terminal of the first field effect transistor T16 is connected to the gate terminal of the first field effect transistor T16, to the drain terminal of the second field effect transistor T26, to the gate terminal of the fourth field effect transistor T46, to the gate terminal of the sixth field effect transistor T66 and to the gate terminal of the eighth field effect transistor T86. A source terminal of the third field effect transistor T36 is connected to the gate terminal of the third field effect transistor T36, to the drain terminal of the fourth field effect transistor T46 and to the gate terminal of the fifth field effect transistor T56. The source terminal of the fifth field effect transistor T56 is connected to the drain terminal of the sixth field effect transistor T66 and to the gate terminal of the seventh field effect transistor T76. The source terminal of the seventh field effect transistor T76 is connected to the drain terminal of the eighth field effect transistor T86. A clamp diode D6 is provided and the drain terminal of the eighth T86 is connected to the positive terminal of this diode D6 and the source terminal of the eighth field effect transistor T86 is connected to the negative terminal of this diode D6.

The series circuit of NOFF (normally off) transistor T95 and diode D5 (FIG. 5) limits the gate potential of T76 in FIG. 6, this series circuit causing the voltage at point C to be limited to the sum of a diode forward voltage and of the gate-source voltage of T95.

The voltage that corresponds to the defined high level will be established at the anode of the diode D5 since the diode is of the same type as the gate-source diode of a gate. The transistor T95 serves for the compensation of the gate-source voltage of T75. Since the transistors T75 and T95 are of the same type, gate-source voltages that deviate only slightly from one another will be established. This is especially true when the ratios of the currents to the transistor dimensions of T75 and T95 coincide. As a consequence of the same, but weak dependency of the gate voltage on the drain current, the two gate-source voltages will still coincide even for considerable deviations of the aforementioned load relationships. In particular, fluctuations of the threshold voltages of the NOFF (normally off) transistors are compensated in this fashion. A voltage that corresponds to the level set by the diode D5 will be established as a stable high level at the output (point D) of the amplifier with little dependency on the current to be supplied.

The diode D9 has the function of limiting the gate voltage of T55 and, thus, the current through T55, T95 and D5.

More specifically in the circuit of FIG. 5, a ninth field effect transistor T95 is provided. The gate terminal of the ninth field effect transistor T95 is connected to the drain terminal of the sixth field effect transistor T65 and, the drain terminal of this ninth field effect transistor T95 is connected to the gate terminal of the seventh field effect transistor T75. A first diode D5 and a second diode D9 are provided. The source terminal of the ninth field effect transistor T95 is connected to the positive terminal of this first diode D5 and the source terminal of the third T35 is connected to the positive terminal of this second diode D9. The negative terminals of the first diode D5 and of the second diode D9 are connected to one another and the negative terminal of the first diode D5 is connected to the source terminal of the eighth field effect transistor T85.

Figure 10:
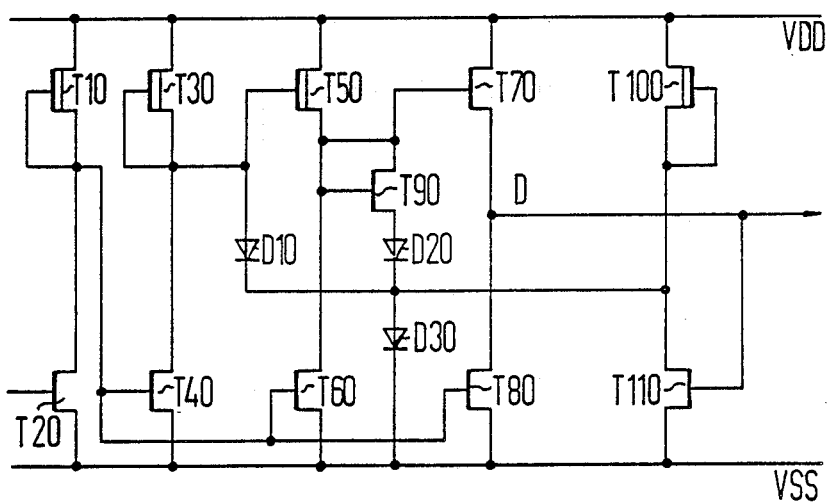
FIG. 10 is a circuit diagram of an amplifier circuit of the present invention with transient overdrive.

FIG. 10 shows a power amplifier circuit having low power consumption, defined high level and transient, i.e. brief-duration overdriving for increasing the switching speed.

The combination of diode D5 and transistor T95 in FIG. 5 does not become suddenly conductive when a switching threshold is reached; rather, it becomes gradually conductive beginning at lower voltages. The voltage rise at the output (point D) is also decelerated due to the gradual rise of the current through T95 and D5. This means a deterioration of the steepness of the leading edge.

FIG. 10 shows the solution of the present invention for eliminating the influence of the limiter circuit on the leading edge. The negative terminals (cathodes) of the diodes D10 and D20 are not kept statically at ground, but are controlled with the inventer composed of T100 and T110. What this achieves is that the level limitation only becomes active when the output of the amplifier exceeds the switching threshold of the inverter T100, T110 and the inverter brings the negative terminals of D10 and D20 in the proximity of the grounded potential. Since this is the case only after the running time through the inverter, the gate potential can briefly overshoot beyond its constant maximum level. As a result thereof, the leading edge of the output voltage of the amplifier remains extremely steep until it reaches its maximum value. This transient overdrive can be further intensified by integrating additional running time. Since the arrangement set forth herein has a feedback circuit, care must be exercised to insure that no loop amplification results in that condition of the circuit in which the limiter circuit is active, this being necessary in order to avoid a tendency towards oscillation. This can be achieved by a suitable dimensioning of T110.

The diode D30 serves the purpose of limiting the overshooting of the gate potential of T70 given high supply voltages.

More specifically in the circuit of FIG. 10 a third diode (D30), a tenth field effect transistor (T100) and an eleventh Field effect transistor (T110) are provided. The positive terminal of this third diode (D30) is connected to the negative terminal of the second diode (D10) and the negative terminal of this third diode (D30) is connected to the source terminal of the eighth field effect transistor (T80).

The drain terminal of the tenth field effect transistor (T100) is connected to the drain terminal of the seventh field effect transistor (T70) and the source terminal of the tenth field effect transistor (T100) is connected to the gate terminal of the tenth field effect transistor (T100), to the drain terminal of the eleventh field effect transistor (110) and to the positive terminal of the third diode (D30). The source terminal of the eleventh field effect transistor (T110) is connected to the source terminal of the eighth field effect transistor (T110) is connected to the drain terminal of the eighth field effect transistor (T80).

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:
1. An amplifier circuit comprising:
a first field effect transistor (T16), a second field effect transistor (T26), a third field effect transistor (T36), a fourth field effect transistor (T46), a fifth field effect transistor (T56), a sixth field effect transistor (T66), a seventh field effect transistor (T76) and an eighth field effect transistor (T86);
the first field effect transistor (T16), the third field effect transistor (T36) and the fifth field effect transistor (T56) being NON (normally on) transistors;

the second field effect transistor (T26), the fourth field effect transistor (T46), the sixth field effect transistor (T66), the seventh field effect transistor (T76) and the eighth field effect transistor (T86) being NOFF (normally off) transistors;

drain terminals of the first field effect transistor (T16), of the third field effect transistor (T36), of the fifth field effect transistor (T56) and of the seventh field effect transistor (T76) connected to one another;

source terminals of the second field effect transistor (T26), of the fourth field effect transistor (T46), of the sixth field effect transistor (T66) and of the eighth field effect transistor (T86) connected to one another;

a source terminal of the first field effect transistor (T16) connected to a gate terminal of the first field effect transistor (T16), to a drain terminal of the second field effect transistor (T26), to a gate terminal of the fourth field effect transistor (T46), to a gate terminal of the sixth field effect transistor (T66) and to a gate terminal of the eighth field effect transistor (T86);

a source terminal of the third field effect transistor (T36) connected to a gate terminal of the third field effect transistor (T36), to a drain terminal of the fourth field effect transistor (T46) and to a gate terminal of the fifth field effect transistor (T56);

a source terminal of the fifth field effect transistor (T56) connected to a drain terminal of the sixth field effect transistor (T66) and to a gate terminal of the seventh field effect transistor (T76);

a source terminal of the seventh field effect transistor (T76) connected to a drain terminal of the eighth field effect transistor (T86);

a diode (D6) having a positive terminal and a negative terminal;

the drain terminal of the eighth field effect transistor (T86) connected to the positive terminal of the diode (D6); and the source terminal of the eighth field effect transistor (T86) connected to the negative terminal of the diode (D6).

2. The amplifier circuit according to claim 1, wherein the amplifier circuit further comprises:

a ninth field effect transistor (T95);

a gate terminal of the ninth field effect transistor (T95) connected to the drain terminal of the sixth field effect transistor (T65);

a drain terminal of the ninth field effect transistor (T95) connected to the gate terminal of the seventh field effect transistor (T75);

a first diode (D5) having a positive terminal and a negative terminal and a second diode (D9) having a positive terminal and a negative terminal;

a source terminal of the ninth field effect transistor (T95) connected to the positive terminal of the first diode (D5);

the source terminal of the third field effect transistor (T35) connected to the positive terminal of the second diode (D9);

the negative terminals of the first diode (D5) and of the second diode (D9) connected to one another; and the negative terminal of the first diode (D5) connected to the source terminal of the eighth field effect transistor (T85).

3. The amplifier circuit according to claim 2, wherein the amplifier circuit further comprises:

a third diode (D30) having a positive terminal and a negative terminal;

a tenth field effect transistor (T100) and an eleventh field effect transistor (T110);

the positive terminal of the third diode (D30) connected to the negative terminal of the second diode (D10);

the negative terminal of the third diode (D30) connected to the source terminal of the eighth field effect transistor (T80);

a drain terminal of the tenth field effect transistor (T100) connected to the drain terminal of the seventh field effect transistor (T70);

a source terminal of the tenth field effect transistor (T100) connected to a gate terminal of the tenth field effect transistor (T100), to a drain terminal of the eleventh field effect transistor (T110) and to the positive terminal of the third diode (D30);

a source terminal of the eleventh field effect transistor (T110) connected to the source terminal of the eighth field effect transistor (T80); and a gate terminal of the eleventh field effect transistor (T110) connected to the drain terminal of the eighth field effect transistor (T80).

4. An amplifier circuit comprising:

a first field effect transistor, a second field effect transistor, a third field effect transistor, a fourth field effect transistor, a fifth field effect transistor, a sixth field effect transistor, a seventh field effect transistor and an eighth field effect transistor;

the first field effect transistor, the third field effect transistor and the fifth field effect transistor being NON (normally on) transistors;

the second field effect transistor, the fourth field effect transistor, the sixth field effect transistor, the seventh field effect transistor and the eighth field effect transistor being NOFF (normally off transistors;

drain terminals of the first field effect transistor, of the third field effect transistor, of the fifth field effect transistor and of the seventh field effect transistor connected to one another;

source terminals of the second field effect transistor, of the fourth field effect transistor, of the sixth field effect transistor and of the eighth field effect transistor connected to one another;

a source terminal of the first field effect transistor connected to a gate terminal of the first field effect transistor, to a drain terminal of the second field effect transistor, to a gate terminal of the fourth field effect transistor, to a gate terminal of the sixth field effect transistor and to a gate terminal of the eighth field effect transistor;

a source terminal of the third field effect transistor connected to a gate terminal of the third field effect transistor, to a drain terminal of the fourth field effect transistor and to a gate terminal of the fifth field effect transistor;

a source terminal of the fifth field effect transistor connected to a drain terminal of the sixth field effect transistor and to a gate terminal of the seventh field effect transistor;

a source terminal of the seventh field effect transistor connected to a drain terminal of the eighth field effect transistor;

a ninth field effect transistor;

a gate terminal of the ninth field effect transistor connected to the drain terminal of the sixth field effect transistor;

a drain terminal of the ninth field effect transistor connected to the gate terminal of the seventh field effect transistor;

a first diode having a positive terminal and a negative terminal and a second diode having a positive terminal and a negative terminal;

a source terminal of the ninth field effect transistor connected to the positive terminal of the first diode;

the source terminal of the third field effect transistor connected to the positive terminal of the second diode;

the negative terminals of the first diode and of the second diode connected to one another; and the negative terminal of the first diode connected to the source terminal of the eighth field effect transistor.

5. An amplifier circuit comprising:

a first field effect transistor, a second field effect transistor, a third field effect transistor, a fourth field effect transistor, a fifth field effect transistor, a sixth field effect transistor, a seventh field effect transistor and an eighth field effect transistor;

the first field effect transistor, the third field effect transistor and the fifth field effect transistor being NON (normally on) transistors;

the second field effect transistor, the fourth field effect transistor, the sixth field effect transistor, the seventh field effect transistor and the eighth field effect transistor being NOFF (normally off) transistors;

drain terminals of the first field effect transistor, of the third field effect transistor, of the fifth field effect transistor and of the seventh field effect transistor connected to one another;

source terminals of the second field effect transistor, of the fourth field effect transistor, of the sixth field effect transistor and of the eighth field effect transistor connected to one another;

a source terminal of the first field effect transistor connected to a gate terminal of the first field effect transistor, to a drain terminal of the second field effect transistor, to a gate terminal of the fourth field effect transistor, to a gate terminal of the sixth field effect transistor and to a gate terminal of the eighth field effect transistor;

a source terminal of the third field effect transistor connected to a gate terminal of the third field effect transistor, to a drain terminal of the fourth field effect transistor and to a gate terminal of the fifth field effect transistor;

a source terminal of the fifth field effect transistor connected to a drain terminal of the sixth field effect transistor and to a gate terminal of the seventh field effect transistor;

a source terminal of the seventh field effect transistor connected to a drain terminal of the eighth field effect transistor;

a ninth field effect transistor;

a gate terminal of the ninth field effect transistor connected to the drain terminal of the sixth field effect transistor;

a drain terminal of the ninth field effect transistor connected to the gate terminal of the seventh field effect transistor;

a first diode having a positive terminal and a negative terminal and a second diode having a positive terminal and a negative terminal;

a source terminal of the ninth field effect transistor connected to the positive terminal of the first diode;

the source terminal of the third field effect transistor connected to the positive terminal of the second diode;

the negative terminals of the first diode and of the second diode connected to one another; and a third diode having a positive terminal and a negative terminal;

a tenth field effect transistor and an eleventh field effect transistor;

the positive terminal of the third diode connected to the negative terminal of the second diode;

the negative terminal of the third diode connected to the source terminal of the eighth field effect transistor;

a drain terminal of the tenth field effect transistor connected to the drain terminal of the seventh field effect transistor;

a source terminal of the tenth field effect transistor connected to a gate terminal of the tenth field effect transistor, to a drain terminal of the eleventh field effect transistor and to the positive terminal of the third diode;

a source terminal of the eleventh field effect transistor connected to the source terminal of the eighth field effect transistor; and a gate terminal of the eleventh field effect transistor connected to the drain terminal of the eighth field effect transistor.

6. An amplifier circuit comprising:

a first field effect transistor, a second field effect transistor, a third field effect transistor, a fourth field effect transistor, a fifth field effect transistor, a sixth field effect transistor, a seventh field effect transistor and an eighth field effect transistor;

the first field effect transistor, the third field effect transistor and the fifth field effect transistor being NON (normally on) transistors;

the second field effect transistor, the fourth field effect transistor, the sixth field effect transistor, the seventh field effect transistor and the eighth field effect transistor being NOF (normally off) transistors;

drain terminals of the first field effect transistor, of the third field effect transistor, of the fifth field effect transistor and of the seventh field effect transistor connected to one another;

source terminals of the second field effect transistor, of the fourth field effect transistor, of the sixth field effect transistor and of the eighth field effect transistor connected to one another;

a source terminal of the first field effect transistor connected to a gate terminal of the first field effect transistor, to a drain terminal of the second field effect transistor, to a gate terminal of the fourth field effect transistor, to a gate terminal of the sixth field effect transistor and to a gate terminal of the eighth field effect transistor;

a source terminal of the third field effect transistor connected to a gate terminal of the third field effect transistor, to a drain terminal of the fourth field effect transistor and to a gate terminal of the fifth field effect transistor;

a source terminal of the fifth field effect transistor connected to a drain terminal of the sixth field effect transistor and to a gate terminal of the seventh field effect transistor;

a source terminal of the seventh field effect transistor connected to a drain terminal of the eighth field effect transistor and being an output of the amplifier circuit;

means for limiting the output of the amplifier circuit.

7. The amplifier circuit according to claim 6, wherein said means for limiting is a clamp diode having a positive terminal connected to the drain terminal of the eighth field effect transistor and a negative terminal connected to the source terminal of the eighth field effect transistor.

8. The amplifier circuit according to claim 6, wherein the means for limiting has:

a ninth field effect transistor;

a gate terminal of the ninth field effect transistor connected to the drain terminal of the sixth field effect transistor;

a drain terminal of the ninth field effect transistor connected to the gate terminal of the seventh field effect transistor;

a first diode having a positive terminal and a negative terminal and a second diode having a positive terminal and a negative terminal;

a source terminal of the ninth field effect transistor connected to the positive terminal of the first diode;

the source terminal of the third field effect transistor connected to the positive terminal of the second diode;

the negative terminals of the first diode and of the second diode connected to one another; and the negative terminal of the first diode connected to the source terminal of the eighth field effect transistor.

9. The amplifier circuit according to claim 6, wherein the means for limiting has:

a third diode having a positive terminal and a negative terminal;

a tenth field effect transistor and an eleventh field effect transistor;

the positive terminal of the third diode connected to the negative terminal of the second diode;

the negative terminal of the third diode connected to the source terminal of the eighth field effect transistor;

a drain terminal of the tenth field effect transistor connected to the drain terminal of the seventh field effect transistor;

a source terminal of the tenth field effect transistor connected to a gate terminal of the tenth field effect transistor, to a drain terminal of the eleventh field effect transistor and to the positive terminal of the third diode;

a source terminal of the eleventh field effect transistor connected to the source terminal of the eighth field effect transistor; and a gate terminal of the eleventh field effect transistor connected to the drain terminal of the eighth field effect transistor.

* * * * *